United States Patent [19]

Rabjohn

[11] Patent Number: 4,816,784

[45] Date of Patent: Mar. 28, 1989

[54] BALANCED PLANAR TRANSFORMERS

[75] Inventor: Gordon G. Rabjohn, Kanata, Canada

[73] Assignee: Northern Telecom Limited, Montreal, Canada

[21] Appl. No.: 145,171

[22] Filed: Jan. 19, 1988

[51] Int. Cl.[4] .............................................. H03H 7/42
[52] U.S. Cl. .................................... 333/24 R; 333/25; 336/183; 336/188; 336/200; 336/232
[58] Field of Search ............................... 333/25, 26, 32; 336/232, 200, 183, 188, 189; 455/326, 332

[56] References Cited

U.S. PATENT DOCUMENTS

| | | | |
|---|---|---|---|
| 3,181,096 | 4/1965 | Raub | 336/183 X |
| 3,305,814 | 2/1967 | Moyer | 336/200 |
| 3,904,991 | 9/1975 | Ishii et al. | 333/116 |
| 4,080,585 | 3/1978 | Molthen | 336/200 |
| 4,538,132 | 8/1985 | Hiyama et al. | 336/232 X |

FOREIGN PATENT DOCUMENTS

| | | | |
|---|---|---|---|
| 1271230 | 6/1968 | Fed. Rep. of Germany | 333/25 |
| 208911 | 9/1986 | Japan | 333/25 |
| 293012 | 12/1986 | Japan | 333/25 |

OTHER PUBLICATIONS

"Computer Simulation and Experimental Investigation of Square Spiral Transformers for MMIC Applications", by L. Wiemer et al., IEE Colloquim on Computer Aided Design of Microwave Circuits, Digest #99, Nov. 11, 1985, pp. 2/1 to 2/5.

Primary Examiner—Eugene R. LaRoche
Assistant Examiner—Benny Lee
Attorney, Agent, or Firm—R. John Haley

[57] ABSTRACT

A monolithic transformer comprises two windings arranged in a plane with conductors of the windings interleaved with and crossing one another, whereby each winding is symmetrical with respect to a center point of the winding, to which a center tap connection can be made. The conductors of the windings and crossings therebetween can be arranged so that adjacent conductors belong to the different windings for maximum coupling. An unbalanced circuit can be connected between the center tap and one end of a winding, the other end electrically floating, to compensate for the effects of the unbalanced circuit on interwinding capacitance. The transformer can be constructed using air bridge technology with conductors supported by and spaced from a surface of a substrate.

30 Claims, 6 Drawing Sheets

BALANCED PLANAR TRANSFORMERS

This invention relates to planar transformers, and is particularly but not exclusively concerned with balanced monolithic transformers for use at microwave frequencies, for example in a double balanced mixer of a microwave radio receiver.

It is known to provide a planar transformer, especially in monolithic form for operation at gigahertz frequencies, comprising two interleaved spiral inductors. For example, a paper entitled "Computer Simulation and Experimental Investigation of Square Spiral Transformers for MMIC Applications" by L. Wiemer et al., IEE Colloquium on Computer Aided Design of Microwave Circuits, Digest #99, Nov. 11, 1985, pp. 2/1 to 2/5 describes characteristics of such a transformer, based on representation of the transformer as a four port network or directional coupler.

A problem arises in the practical use of such transformers. More particularly, it is commonly required to use such transformers in, or for coupling to balanced circuits, for which at least one of the transformer windings must be center tapped. However, determination of an optimum center tapping point on a planar spiral winding is difficult, and the center tapping point may be correct for only one frequency, or a very narrow band of frequencies, due to compromises between capacitive and inductive effects for the two halves of the tapped winding.

It is also known from Ishii et al. U.S. Pat. No. 3,904,991 issued Sept. 9, 1975 and entitled "Stripline Directional Coupler Having Bent Coupling Arms" to provide a coupled strip line directional coupler comprising two quarter wavelength directional coupling units connected in cascade, each centrally bent through a right angle so that the two units form an approximately diamond-shaped arrangement.

An object of this invention is to provide an improved planar transformer.

According to one aspect of this invention there is provided a planar transformer comprising two windings each having at least one turn, the two windings being arranged in substantially a single plane with conductors of the windings interleaved with and crossing one another whereby each wind is symmetrical about a line passing through center points of both of the windings, and a center tap connection to the center point of at least one of the windings.

Thus in accordance with this invention the interleaved conductors of the two windings of the transformer are arranged to cross one another to achieve symmetry of each winding with respect to a center point of the winding, at which point a center tap connection can be made. Because of the symmetry of the winding, this center tap is optimally positioned, and the two halves of the winding are inductively and capacitively balanced, for all frequencies within a very broad frequency range.

One or both of the windings may have more than one turn, with typically the number of turns of the two windings being substantially the same. In this case the two windings preferably have substantially the same physical arrangement in said plane. Thus the two windings may be substantially identical to one another, with one winding rotated and translated in said plane with respect to the other winding, whereby the conductors of the two windings are interleaved and connections can be conveniently made thereto. If each winding has n turns, then in such a transformer the conductors of the windings may typically cross one another at a number of $4n-2$ locations.

Each winding may have an integer number of turns, but this is not necessarily the case, and the windings may alternatively have non-integer numbers of turns. In particular, embodiments of the invention are described below in which each winding has a number $(2p+1)/2$ turns, where p is a positive integer, which can provide advantageous arrangements in certain circumstances.

In order to provide close coupling between the windings, preferably the conductors of the windings and the crossings therebetween are arranged in such manner that any two adjacent conductors comprise one conductor of each winding; in other words conductors of the two windings alternate with one another when considered in order from within to outside the turns of the windings. To this end the crossings between conductors of the windings may comprise cross-overs between conductors in different turns of the same winding.

Advantageously both windings may be center tapped. In this case the transformer may include means for connecting an unbalanced circuit between one end and the center tap connection of one of the windings and for allowing the other end of this one of the windings to remain electrically floating. This arrangement compensates for imbalances due to circuits connected in use to the transformer, for improved operation.

In order to reduce capacitive effects by providing an air space beneath the conductors of the windings, preferably the conductors of the windings comprise conductors supported by and spaced from a surface of a substrate, whereby said plane is spaced from said surface of the substrate. In this case each crossing between conductors of the windings conveniently comprises a conductor supported by and spaced from the surface of the substrate and a conductor on the surface of the substrate.

In different embodiments of the invention the crossings between conductors of the windings may comprise two fewer crossings than there are total turns of the two windings together, and each crossing may comprise a cross-over between conductors in different turns of the same winding.

The two windings need not necessarily have the same number of turns, but conveniently any difference between the numbers of turns of the two windings is not greater than one.

According to another aspect, this invention provides a planar transformer comprising a first winding having at least one turn and a second winding having more than one turn, the two windings being arranged in substantially a single plane with conductors of the windings interleaved with and crossing one another whereby each winding is symmetrical about a line passing through center points of both of the windings.

The invention also provides a planar transformer comprising two windings each having at least one turn, the two windings being arranged in substantially a single plane with conductors of the windings supported by and spaced from a surface of a substrate, said conductors being interleaved with and crossing one another whereby each winding is symmetrical with respect to a center point of the winding.

The invention will be further understood from the following description with reference to the accompanying drawings, in which:

FIG. 1 schematically illustrates a known form of monolithic transformer;

FIG. 2 schematically illustrates a single turn monolithic transformer in accordance with an embodiment of the invention;

FIG. 3(a) schematically illustrates a monolithic transformer, having two turns and a center-tapped secondary, in accordance with another embodiment of the invention;

FIG. 3(b) schematically illustrates an improved form of the transformer of FIG. 3(a);

FIG. 3(c) illustrates a modified form of the transformer of FIG. 3(b);

FIGS. 4(a), 4(b), and 4(c schematically illustrate further forms of transformer in accordance with embodiments of the invention;

FIGS. 5(a), 5(b), 5(c), and 5(d) schematically illustrate further forms of transformer, having non-integer numbers of turns, in accordance with embodiments of the invention;

Figure 7:
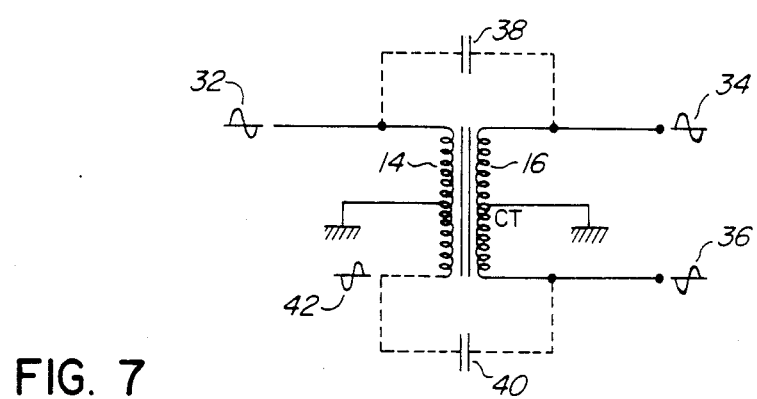
FIG. 7 shows a modified equivalent circuit.
Figure 8:
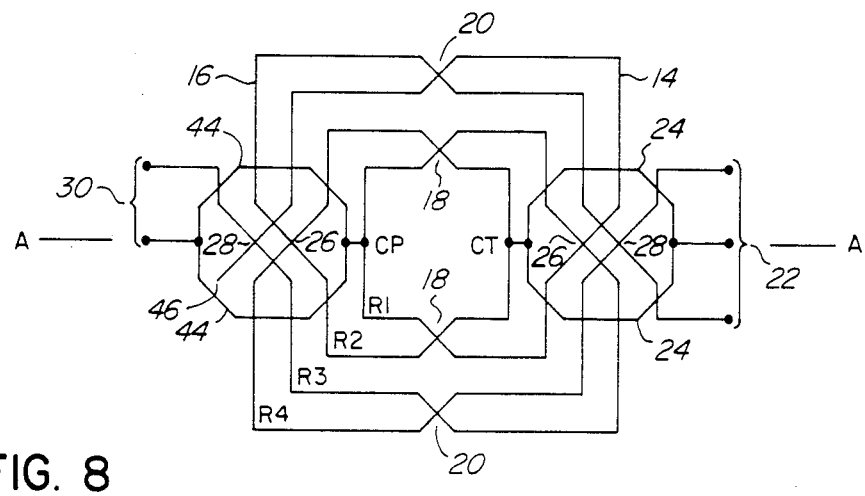

FIG. 8 schematically illustrates a monolithic transformer in accordance with a further embodiment of the invention, corresponding to the equivalent circuit of FIG. 7;

FIG. 9 illustrates a practical form of monolithic transformer, corresponding to FIG. 8 but with a greater number of turns; and FIG. 10 is a sectional illustration showing the construction of part of the transformer of FIG. 9.

The same references are used in different figures throughout the drawings to denote similar components.

Figure 1:
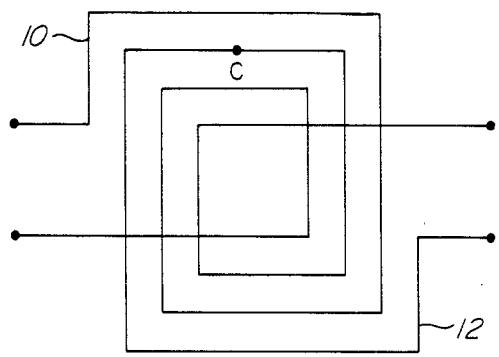

Referring to FIG. 1, a known form of monolithic transformer consists of two spiral windings 10 and 12, respectively primary and secondary windings, each of which is shown as having two turns. The two spiral windings are substantially identical to one another, but one is rotated and translated in relation to the other to produce the form shown.

A significant application for such a monolithic transformer is in microwave radio receivers, at frequencies of several gigahertz, and in particular in balanced circuits such as a double balanced mixer in which such transformers may be used for coupling radio frequency and local oscillator signals. In such an application it is necessary for the secondary winding of the transformer to be center-tapped, and for the two halves of the secondary winding to be closely matched.

A center tap for the secondary winding 12 in FIG. 1 might be somewhere in the region of the point marked C. However, determining the position of the center tap for this winding is difficult, and the center tap position can not be optimal for all frequencies and does not result in balancing of the two halves of the secondary winding. These drawbacks arise from the facts that the turn radius varies throughout the winding, so that the inductance per turn increases greatly from the inside to the outside of the spiral and the inductance per unit length increases slightly, and interwinding capacitance varies in a manner which is difficult to calculate Thus typically the center tap position is frequency-dependent and may be a compromise between different positions required for inductive and capacitive balancing.

Figure 2:
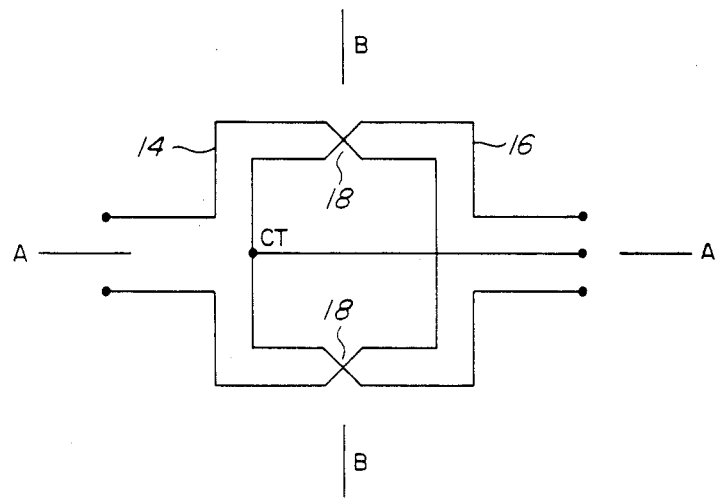

FIG. 2 shows a monolithic transformer, comprising a primary winding 14 and center tapped secondary winding 16 each having a single turn, in which the above disadvantages are avoided. Instead of the monotonic spiral windings 10 and 12 of FIG. 1, in the transformer of FIG. 2 each winding comprises a spiral inwardly to a central point and then outwardly again, the winding being symmetrical on each side of this central point. This central point, for example the point CT in FIG. 2 for the winding 16, clearly defines for the winding a center tapping point which is independent of frequency and which ensures that the winding halves on each side of it are inductively and capacitively equal. This equality is evident from the fact that the transformer is symmetrical about a horizontal line A—A passing through the point CT; the turns themselves are also substantially symmetrical about a vertical line B—B passing through their center. More particularly, in FIG. 2 the line A—passes through the center points of both windings of the transformer and each winding is symmetrical about this line; the same applies to each other embodiment of this invention.

The symmetry of the transformer and its windings is produced by providing interchanged positions or cross-overs of the conductors of the windings. For the single-turn windings 14 and 16, as shown in FIG. 1 there are two such cross-overs 18, centered on the line B—B and symmetrically on each side of the line A—A. The cross-overs 18, at each of which the winding conductors cross one another but do not join or contact one another, can be formed in any convenient manner such as that described later below.

Figure 3A:
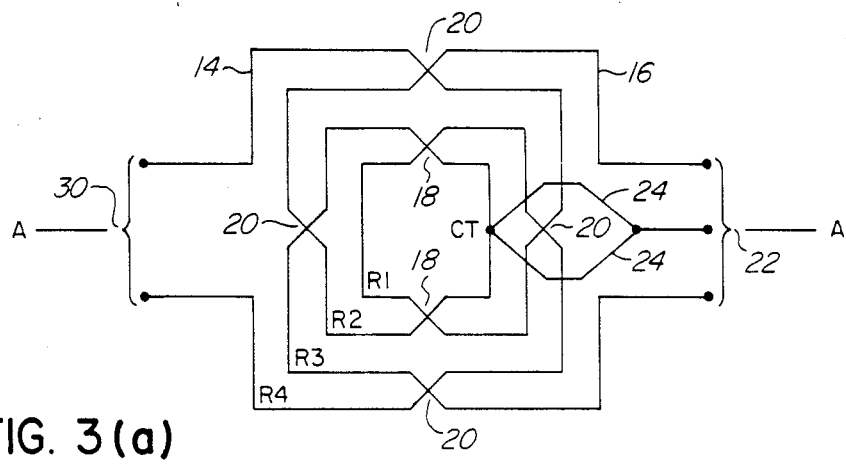

FIG. 3(a) illustrates another monolithic transformer having primary and secondary windings 14 and 16 each of which has two turns. As a result of the extra turn for each winding, and to maintain symmetry about the horizontal line A—A, the transformer of FIG. 3(a) includes not only the two cross-overs 18 but a further four, similar, cross-overs 20. In addition, the even number of turns results in the point CT on the secondary winding being at the right-hand side, as illustrated, of the transformer, i.e on the same side of the transformer as secondary winding connections 22. In FIG. 3(a) these connections 22 include symmetrically-arranged conductors 24 forming a connection to the center tap point CT. The conductors 24 cross the conductors of the windings 14 and 16 in the same manner as for the cross-overs 18 and 20.

Thus the arrangement of FIG. 3(a) provides a closely matched and balanced transformer with a single-ended input (connection 30) and a double-ended or push-pull output (connections 22). Such a transformer is well suited for use in a double balanced mixer of a microwave radio receiver. However, for other applications the primary winding 14 may instead, or as well, be center tapped in a similar manner, or neither winding may have a center tap.

The arrangement of FIG. 3(a) has a disadvantage in that different turns of each winding 14 or 16 run adjacent one another over parts of their lengths, rather than the conductors of the two different windings always being adjacent one another. As a result, there is some reduction in coupling between the windings. This disadvantage is avoided by the alternative arrangement shown in FIG. 3(b). For convenience of description, particularly in distinguishing between FIGS. 3(a) and 3(b), reference is made below to rings of the windings, numbered from the innermost ring (ring 1) to the outermost ring (ring 4), designated R1 to R4 in each of FIGS. 3(a) and 3(b). It should be appreciated, however, that these designations do not refer to turns or conductors of the windings themselves, because each ring is made up of different parts of both windings 14 and 16.

In the transformer of FIG. 3(a), the cross-overs 18 are between horizontal conductors in the rings R1 and R2, and two of the cross-overs 20 are between horizontal conductors in the rings R3 and R4. The same applies to the transformer of FIG. 3(b).

Figure 3B:
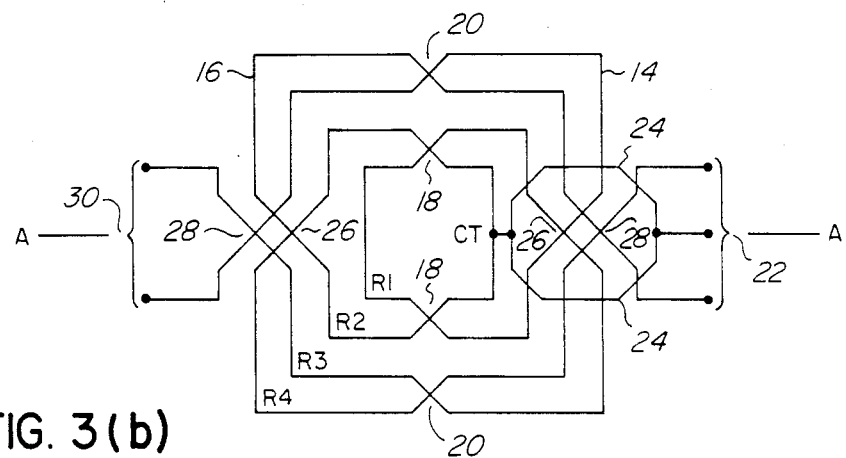

In the transformer of FIG. 3(a), the other two cross-overs are between vertical conductors in the rings R2 and R3 with primary winding connections 30 and the second winding connections 22 to vertical conductors in the ring R4. In the transformer of FIG. 3(b), however, cross-overs 26 are provided between vertical conductors in non-adjacent rings R2 and R4, and the primary winding connections 30 and secondary connections 22 are made to conductors in the ring R3, as shown via optional cross-overs 28.

As a result of this rearrangement of the cross-overs and winding connections, conductors of the two windings 14 and 16 are consistently interleaved throughout the rings R1 to R4 of the transformer of FIG. 3(b), whereby coupling between the windings is enhanced in relation to the coupling of the transformer of FIG. 3(a), whilst still providing the same advantages. In other words, any two adjacent conductors in the transformer of FIG. 3(b) comprise one conductor of each winding.

Figure 3C:
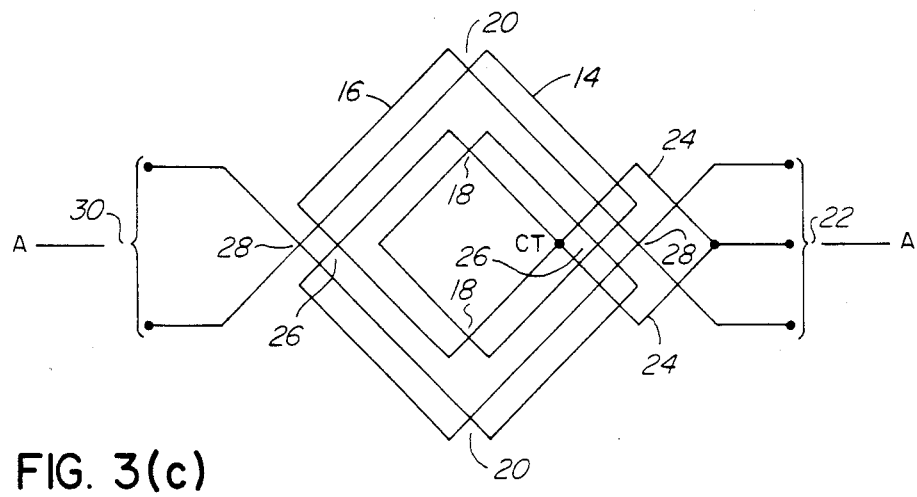

FIG. 3(c) illustrates a modified form of the transformer of FIG. 3(b); the cross-overs 18, 20, 26 and 28 are identical, and only the paths of the conductors of the windings 14 and 16 between the cross-overs are changed. Obviously other arrangements of the conductors, including rectangular, circular, and octagonal arrangements, may be provided in a similar manner.

The arrangements of the transformers of FIGS. 2, 3(a), 3(b), and 3(c) can be modified and extended to provide arbitrary numbers of turns and different rearrangements of cross-overs and connections. For example, the center taps could be provided on an outer ring, and the connections to the ends of the windings could be made on an inner ring, rather than being the other way round as shown. In these transformers, the primary and secondary windings 14 and 16 are identical to one another. Generally, rearrangements which retain such identity will still provide two cross-overs for the first turn, and four cross-overs for each subsequent turn, of the windings, so that transformers with primary and secondary windings each of 1, 2, 3, 4 . . . turns will have respectively 2, 6, 10, 14 . . . cross-overs, or more generally windings of n turns will have 4n−2 cross-overs.

Figure 4A:
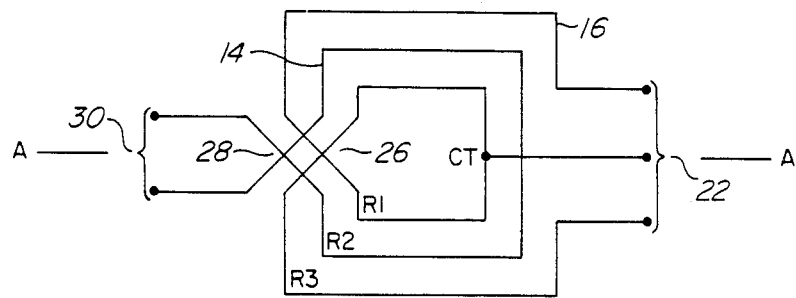
Figure 4B:
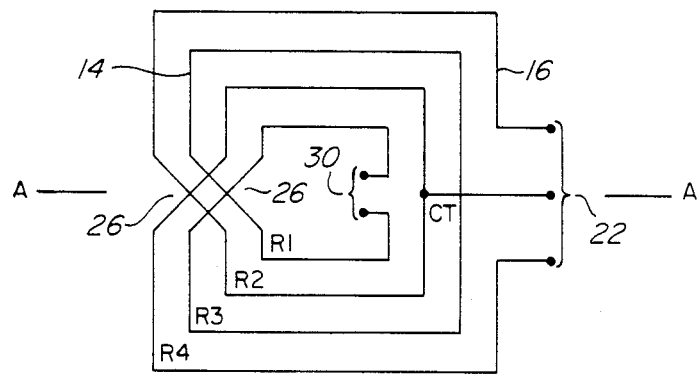
Figure 4C:
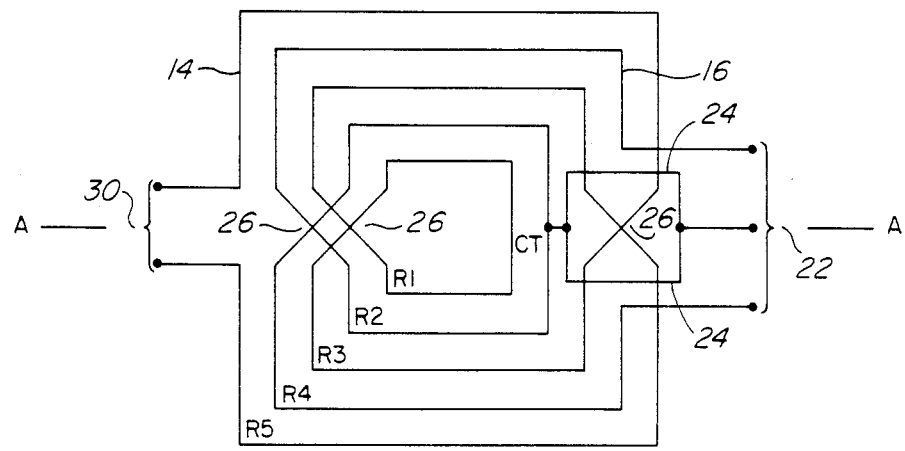

FIGS. 4(a), 4(b), and 4(c) illustrate alternative transformer arrangements in accordance with embodiments of the invention, in which the above-described symmetry with respect to a central line A—A is maintained, with consequent maintenance of the advantages provided by such symmetry, but in which the primary winding 14 and the second winding 16 are not identical. The arrangements shown in these figures generally have fewer cross-overs in all, the cross-overs being between non-adjacent rather than adjacent rings, and can facilitate the provision of different turns ratios between the numbers of turns of the primary and secondary windings.

In the transformer of FIG. 4(a), the primary winding 14 has one turn and the secondary winding 16 as two turns, with a cross-over 26 between the secondary winding rings R1 and R3. The secondary winding end connections 22 are taken from the outer ring R3, and the primary winding connections 30 are taken from the ring R2, via an optional cross-over 28.

In the transformer of FIG. 4(b), the primary winding 14 has two turns, in rings R1 and R3, with a cross-over 26 therebetween and connections 30 to the ring R1. In this respect it is observed that other circuitry, not shown, may be provided in known manner within the ring R1. The secondary winding 14 also has two turns, in rings R2 and R4, with a cross-over 26 therebetween and connections 22 to the ends of the winding 14 in the ring R4.

In the transformer of FIG. 4(c), the primary winding 14 has three turns, in rings R1, R3, and R5, with a cross-over 26 between the rings R1 and R3 and another cross-over 26 between the rings R3 and R5, and connections 30 in the ring R5. The secondary winding 16 has two turns, in rings R2 and R4, with a cross-over 26 therebetween, connections 22 to the ends of the winding in the ring R4, and a center tap connection to the point CT in the ring R2 via symmetrical conductors 24.

The transformers of FIGS. 4(a) to 4(c) can be extended in a similar manner with more turns in the windings and more cross-overs 26. Generally, there will be two fewer cross-overs 26 than the total number of turns in the primary and secondary windings. in other words, if the primary winding 14 has $n_p$ turns and the secondary winding 16 has $n_s$ turns, with $|n_p-|n_s|\leq 1$, then the number $n_c$ of cross-overs 26 is given by the equation $n_c = n_p + n_s - 2$.

The transformers of FIGS. 2 to 4 all have primary and secondary windings with integral numbers of turns, but the invention is not limited in this respect. By way of example, FIGS. 5(a) to 5(d) illustrate alternative forms of transformer with non-integral numbers of turns of the primary and secondary windings. More particularly, in these figures each winding has $(2p+1)/2$ turns, where p is a positive integer. Each of these figures illustrates a transformer having a primary winding 14 with a center tap point CP and terminals 30a and 30b, a secondary winding 16 with a center tap point CT and terminals 22a and 22b, cross-overs which for clarity are not referenced, and a line of symmetry A—A.

Figure 5A:
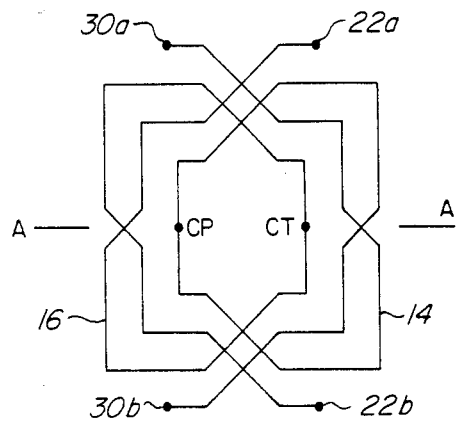
Figure 5B:
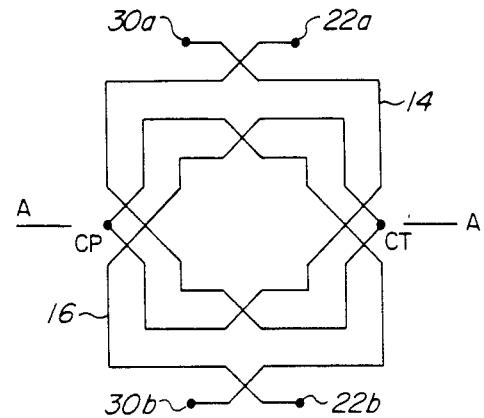
Figure 5C:
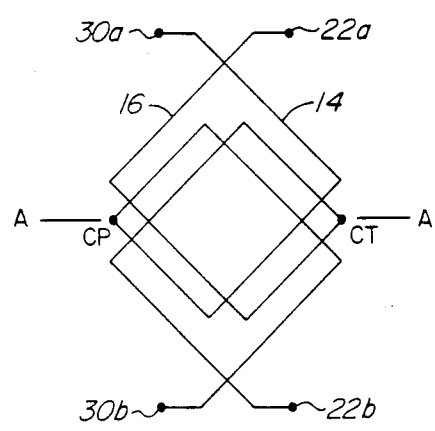
Figure 5D:
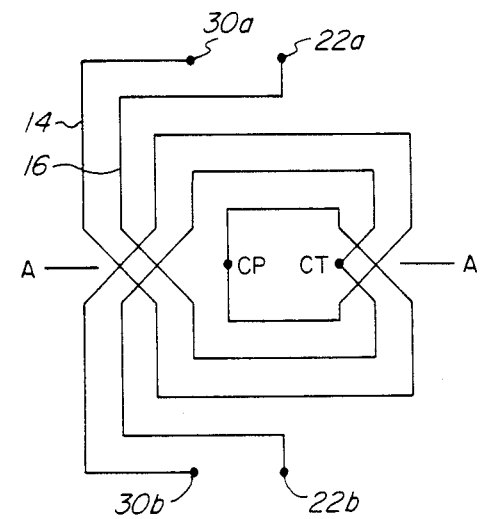

In the transformer of FIG. 5(a), each of the windings 14 and 16 has one-and-a-half turns, but the coupling therebetween is not optimal because, as in the transformer of FIG. 3(a), different turns of each winding 14 or 16 run adjacent one another over parts of their lengths. In the transformer of FIG. 5(b) the windings 14 and 16 are rearranged so that any two conductors running adjacent one another belong to different windings, whereby the coupling between the windings is improved from that of FIG. 5(a), in the same manner that the coupling of the transformer of FIG. 3(b is improved from that of FIG. 3(a). FIG. 5(c illustrates a modified form of the transformer of FIG. 5(b), the modification being similar to that of FIG. 3(c) in relation to FIG. 3(b). FIG. 5(d illustrates a transformer in which the primary winding 14 has two-and-a-half turns, whereas the secondary winding 16 has one-and-a-half turns.

In the transformers of FIGS. 5(aa) to 5(d), the non-integral number of turns of each winding 14 or 16 results in the terminals 30a, 30b or 22a, 22b being on opposite sides of the transformer. This may be of advantage in such circuits as balanced amplifiers in which the two terminals of each winding are connected to respective amplifier units, in that the amplifier units may be arranged on each side of the transformer in an integrated circuit with a balanced layout.

Even though the transformers of FIGS. 2 to 5 can be made perfectly symmetrical, a problem of balancing still exists when they are used as baluns, e.g. for producing balanced anti-phase signals from an unbalanced signal, due to asymmetry of the circuits to which they are connected. This is explained below with reference to FIG. 6.

Figure 6:
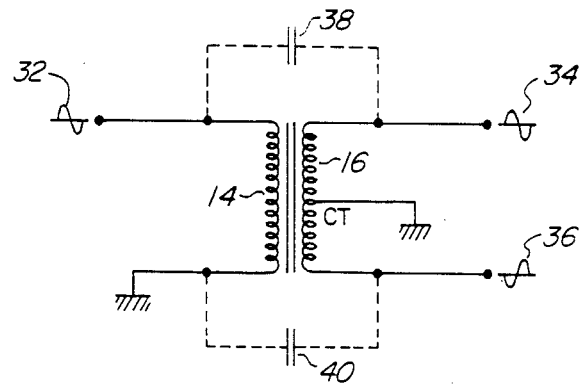
FIG. 6 shows an equivalent circuit of the transformer of FIG. 3(b)

FIG. 6 illustrates a transformer having an unbalanced input to a primary winding 14 and a balanced output from a center-tapped secondary winding 16. The secondary winding center tap CT is grounded, as is one end of the primary winding 14, and an input signal 32 is supplied to the other end of the primary winding. An in-phase output signal 34 and an anti-phased output signal 36 are derived from the ends of the secondary winding 16. FIG. 6 also shows by broken line connections capacitances 38 and 40 between the ends of the windings 14 and 16; these capacitances represent inter-winding capacitances of the transformer between the windings 14 and 16, which give rise to the balancing problem.

Now it can be seen from FIG. 6 that the capacitance 38 is connected between points at which signal voltages are in phase, whereas the capacitance 40 is connected on one side to ground and on the other side to a signal voltage. Consequently, the capacitance 40 is subjected to a different and greater signal voltage than the capacitance 38, and this leads to a considerable asymmetry in the transformer frequency response for the two output signals 34 and 36.

A solution to this problem is illustrated in FIG. 7. As illustrated in this figure, the primary winding 14 is also center tapped and the center tap is grounded, the signal 32 being supplied to one end of the primary winding and the other end being left floating. Consequently, an anti-phased signal 42 is induced at this floating end, which is thus in phase with the anti-phased output signal 36. This substantially eliminates any asymmetry, as both capacitances 38 and 40 are now exposed to the same signal voltage conditions, and the transformer response is considerably improved. The dummy or floating half of the primary winding 14 thus serves to compensate for the effects of the inter-winding capacitances.

FIG. 8 illustrates the transformer of FIG. 3(b) modified in accordance with the principles of FIG. 7. A center point CP of the primary winding 14 is connected via symmetrical conductors 44 to one of the primary winding connections 30, the other of which is connected to one end of the primary winding 14. The other end 46 of the primary winding is left floating. Otherwise, the transformer of FIG. 8 is as described above with reference to FIG. 3(b).

FIG. 9 illustrates, in a greatly enlarged plan view, a practical form of monolithic transformer based on the illustration in FIG. 8 but with each of the windings having a total of four turns. Similar references to those used above are used to denote the corresponding parts of the transformer. There are $4 \times 4 - 2 = 14$ cross-overs, namely the 2 cross-overs 18, 6 cross-overs 20, non-adjacent cross-overs 26, plus the two optional cross-overs 28 at the ends of the windings 14 and 16. Each cross-over is formed as described below with additional reference to the cross-sectional illustration in FIG. 10.

The transformer is formed using so-called air bridge technology on a suitable substrate, which may comprise glass, ceramic, or other insulating material. In an embodiment of the invention the transformer was formed on a gallium arsenide substrate, on which other components of a dual gate field effect transistor double balanced mixer for operation at frequencies up to about 8 GHz were also formed, with the transformer windings 14 and 16 themselves occupying a square area with a side length of about 300 $\mu$m. The square connections 22 and 30 in FIG. 9 represent connection pad terminations on such a substrate, which is referenced 48 in FIG. 10.

With air bridge technology, conductors 50 are elevated above the surface of the substrate 48 for reduced capacitance, and are supported periodically along their lengths on conductive posts 52 which appear as small squares in FIG. 9. For clarity and simplicity, FIG. 9 does not represent all of the posts 52 which would be present along the lengths of the conductors 50. For each cross-over, a conductor 54 is provided directly on the surface of the substrate 48 extending between two posts 52 which are interconnected thereby. Except for such cross-over conductors 54, the connections 22 and 30, the conductors 24 and 44, the posts 52, and a conductor 56, all of the transformer conductors are constituted by the elevated conductors 50.

For forming the conductors 54, posts 52, and elevated conductors 50 on the substrate 48, the substrate conductors 54 are initially deposited on the substrate in the desired pattern, then a photoresist layer is applied and the posts 52 and conductors 50 are deposited in the desired pattern, and then the photoresist is removed to leave the form of structure illustrated in FIG. 10. The conductive parts may conveniently be of gold, with the substrate conductors 54 having a thickness of about 0.4 $\mu$m, the conductors 50 having a thickness of about 1 to 2 $\mu$m, and the air gaps between the conductors 50 and 54 having a thickness of about 1 to 2 $\mu$m.

In FIG. 9, the substrate conductor 56 interconnects the bases of posts 52 at the center taps CP and CT, and is connected (although the connections can not be seen in FIG. 9 as they underlie the elevated conductors 50) to the conductors 44 and 24, which are in turn grounded via respective connections 30 and 22. The two conductors 44 are shown interconnected in FIG. 9; they may instead be connected to individual connection pads for grounding separately.

Although particular embodiments of the invention have been described in detail, it should be appreciated that numerous modifications, variations, and adaptations may be made thereto without departing from the scope of the invention as defined in the claims. For example, it is observed that the invention is not restricted to monolithic transformers, but is also applicable to other planar transformers, such as transformers formed by printed inductors on printed circuit boards, for which in particular plated through holes and conductors on both sides, or in different layers, may be used to provide the necessary cross-overs. Furthermore, it should be understood that transformers in accordance with the invention can also be constructed directly on a substrate and using dielectric cross-overs rather than using air bridge technology as described above.

What is claimed is:

1. A planar transformer comprising two windings each having at least one turn, the two windings being arranged in substantially a single plane with conductors of the windings interleaved with and crossing one another whereby each winding is symmetrical about a line passing through center points of both of the windings, and a center tap connection to the center point of at least one of the windings.

2. A planar transformer as claimed in claim 1 wherein at least one of the windings has more than one turn.

3. A planar transformer as claimed in claim 2 wherein one winding has substantially one more turn than the other winding.

4. A planar transformer as claimed in claim 1 wherein each of the windings has more than one turn.

5. A planar transformer as claimed in claim 4 wherein the two windings have substantially the same number of turns.

6. A planar transformer as claimed in claim 5 wherein the two windings have substantially the same physical arrangement in said plane.

7. A planar transformer as claimed in claim 6 wherein each winding has n turns and the conductors of the windings cross one another at a number of $4n-2$ locations.

8. A planar transformer as claimed in claim 6 wherein the conductors of the windings and the crossings therebetween are arranged in such manner that any two adjacent conductors comprise one conductor of each winding.

9. A planar transformer as claimed in claim 1 wherein the two windings have substantially the same physical arrangement in said plane.

10. A planar transformer as claimed in claim 9 wherein the conductors of the windings and the crossings therebetween are arranged in such manner that any two adjacent conductors comprise one conductor of each winding.

11. A planar transformer as claimed in claim 1 wherein the conductors of the windings and the crossings therebetween are arranged in such manner that any two adjacent conductors comprise one conductor of each winding.

12. A planar transformer as claimed in claim 11 and including center tap connections to the center points of both of the windings.

13. A planar transformer as claimed in claim 12 and including means for connecting an unbalanced circuit between one end and the center tap connection of one of the windings and for allowing the other end of this one of the windings to remain electrically floating.

14. A planar transformer as claimed in claim 13 wherein the conductors of the windings comprise conductors supported by and spaced from a surface of a substrate, whereby said plane is spaced from said surface of the substrate.

15. A planar transformer as claimed in claim 1 and including center tap connections to the center points of both of the windings.

16. A planar transformer as claimed in claim 15 and including means for connecting an unbalanced circuit between one end and the center tap connection of one of the windings and for allowing the other end of this one of the windings to remain electrically floating.

17. A planar transformer as claimed in claim 16 wherein the conductors of the windings comprise conductors supported by and spaced from a surface of a substrate, whereby said plane is spaced from said surface of the substrate.

18. A planar transformer as claimed in claim 1 wherein the conductors of the windings comprise conductors supported by and spaced from a surface of a substrate, whereby said plane is spaced from said surface of the substrate.

19. A planar transformer as claimed in claim 18 wherein each crossing between conductors of the windings comprises a conductor supported by and spaced from the surface of the substrate and a conductor on the surface of the substrate.

20. A planar transformer as claimed in claim 2 wherein said crossings between conductors of the windings comprise two fewer crossings than there are total turns of the two windings together.

21. A planar transformer as claimed in claim 20 wherein each crossing comprises a cross-over between conductors in different turns of the same winding.

22. A planar transformer comprising a first winding having at least one turn and a second winding having more than one turn, the two windings being arranged in substantially a single plane with conductors of the windings interleaved with and crossing one another whereby each winding is symmetrical about a line passing through center points of both of the windings.

23. A planar transformer as claimed in claim 22 wherein any difference between the numbers of turns of the two windings is not greater than one.

24. A planar transformer as claimed in claim 22 wherein the first winding has more than one turn.

25. A planar transformer as claimed in claim 24 wherein the first and second windings have substantially the same physical arrangement in said plane.

26. A planar transformer as claimed in claim 25 wherein the conductors of the windings and the crossings therebetween are arranged in such manner that any two adjacent conductors comprise one conductor of each winding.

27. A planar transformer as claimed in claim 22 wherein the conductors of the windings comprise conductors supported by and spaced from a surface of a substrate, whereby said plane is spaced from said surface of the substrate.

28. A planar transformer as claimed in claim 27 wherein each crossing between conductors of the windings comprises a conductor supported by and spaced from the surface of the substrate and a conductor on the surface of the substrate.

29. A planar transformer comprising two windings each having at least one turn, the two windings being arranged in substantially a single plane with conductors of the windings supported by and spaced from a surface of a substrate, said conductors being interleaved with and crossing one another whereby each winding is symmetrical about a line passing through center points of both of the windings.

30. A planar transformer as claimed in claim 29 wherein each crossing between conductors of the windings comprises a conductor supported by and spaced from the surface of the substrate and a conductor on the surface of the substrate.

* * * * *